(12) United States Patent
Kwak et al.

(10) Patent No.: US 8,399,944 B2
(45) Date of Patent: Mar. 19, 2013

(54) LIGHT EMITTING DIODE AND METHOD FOR FABRICATING THE SAME

(75) Inventors: Joon-seop Kwak, Kyungki-do (KR); Jae-hee Cho, Kyungki-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 10/445,992

(22) Filed: May 28, 2003

(65) Prior Publication Data
US 2004/0041220 A1    Mar. 4, 2004

(30) Foreign Application Priority Data

Sep. 2, 2002   (KR) .................................. 2002-52462

(51) Int. Cl.
*H01L 31/0232* (2006.01)
(52) U.S. Cl. ............ 257/432; 257/103; 257/89; 257/79; 257/98; 257/95; 257/E33.061; 257/E33.074
(58) Field of Classification Search ............... 257/89, 257/90, 94, 96, 12, 13, 14, 432, 103, 79, 257/98, 95, E33.061, E33.074; 438/47, 979
See application file for complete search history.

(56) References Cited

U.S. PATENT DOCUMENTS

| | | | |
|---|---|---|---|
| 3,763,405 A | 10/1973 | Mitsuhata | |
| 5,813,753 A | 9/1998 | Vriens et al. | |
| 5,898,185 A * | 4/1999 | Bojarczuk et al. | 257/103 |
| 5,952,681 A | 9/1999 | Chen | |
| 6,057,561 A * | 5/2000 | Kawasaki et al. | 257/94 |
| 6,528,944 B1 * | 3/2003 | Kishi et al. | 313/582 |
| 6,570,186 B1 * | 5/2003 | Uemura et al. | 257/79 |
| 6,608,332 B2 * | 8/2003 | Shimizu et al. | 257/98 |
| 6,677,617 B2 * | 1/2004 | Tominaga | 257/88 |
| 7,193,246 B1 * | 3/2007 | Tanizawa et al. | 257/94 |
| 2001/0010449 A1 * | 8/2001 | Chiu et al. | 313/501 |
| 2002/0008472 A1 * | 1/2002 | Ha | 313/582 |
| 2002/0040982 A1 | 4/2002 | Uemura | |
| 2002/0043926 A1 | 4/2002 | Takahashi et al. | |
| 2002/0063520 A1 * | 5/2002 | Yu et al. | 313/512 |

(Continued)

FOREIGN PATENT DOCUMENTS

| EP | 0855751 A2 | 7/1998 |
|---|---|---|
| EP | 1 020 935 A2 | 7/2000 |

(Continued)

OTHER PUBLICATIONS

Notice to Submit Response issued by the Korean Patent Office on Nov. 19, 2004 in corresponding application.

(Continued)

*Primary Examiner* — Junghwa M Im
(74) *Attorney, Agent, or Firm* — McDermott Will & Emery LLP (57) ABSTRACT

A light emitting diode and a method for fabricating the same are provided. The light emitting diode includes: a transparent substrate; a semiconductor material layer formed on the top surface of a substrate with an active layer generating light; and a fluorescent layer formed on the back surface of the substrate with controlled varied thicknesses. The ratio of light whose wavelength is shifted while propagating through the fluorescent layer and the original light generated in the active layer can be controlled by adjusting the thickness of the fluorescent layer, to emit desirable homogeneous white light from the light emitting diode.

17 Claims, 10 Drawing Sheets

U.S. PATENT DOCUMENTS

| | | |
|---|---|---|
| 2002/0074558 A1 | 6/2002 | Hata et al. |
| 2003/0080343 A1 | 5/2003 | Tominaga |
| 2004/0048471 A1 | 3/2004 | Okagawa et al. |

FOREIGN PATENT DOCUMENTS

| | | |
|---|---|---|
| EP | 1 111 689 A2 | 6/2001 |
| EP | 1 132 977 A2 | 9/2001 |
| JP | 11-040848 | 2/1999 |
| JP | 11-145512 A | 5/1999 |
| JP | 2000-31532 | 1/2000 |
| JP | 2001-24238 | 1/2001 |
| JP | 2001-085746 A | 3/2001 |
| JP | 2001-217467 A | 8/2001 |
| JP | 2001-226698 A | 8/2001 |
| JP | 2002-033521 | 1/2002 |
| JP | 2002-64220 | 2/2002 |
| JP | 2002-076434 A | 3/2002 |
| JP | 2002-111072 | 4/2002 |
| JP | 2002-141559 | 5/2002 |
| JP | 2002-151744 | 5/2002 |
| JP | 2002164296 A * | 6/2002 |
| JP | 2002-223008 A | 8/2002 |
| JP | 2003-124129 A | 4/2003 |
| JP | 2002-164296 A | 7/2009 |
| KR | 2001-0080203 | 8/2001 |
| WO | WO 97/48138 A | 12/1997 |
| WO | 01/41225 A2 | 6/2001 |
| WO | 01/41225 A3 | 6/2001 |
| WO | WO 01/69692 A | 9/2001 |

OTHER PUBLICATIONS

European Search Report dated Jul. 6, 2006.
Office Action issued on May 12, 2009 in corresponding Japanese patent application No. 2004-212028.
Office Action dated Apr. 20, 2010 in corresponding Japanese Application No. 2003-308044.
Japanese Office Action, and English translation thereof, issued in Japanese Patent Application No. 2011-155881 dated May 15, 2012.
United States Office Action issued in U.S. Appl. No. 13/188,297 dated Jun. 21, 2012.
Office Action issued on Jan. 8, 2013 in the corresponding Japanese patent application No. 2011-155881.

* cited by examiner

FIG. 10B

LIGHT EMITTING DIODE AND METHOD FOR FABRICATING THE SAME

This application claims priority from Korean Patent Application No. 2002-52462, filed on Sep. 2, 2002, in the Korean Intellectual Property Office, the disclosure of which is incorporated herein in its entirety by reference.

BACKGROUND OF THE INVENTION

1. Field of the Invention

The present invention relates to a light emitting diode and a method for fabricating the same, and more particularly, to a light emitting diode capable of emitting light with a homogeneous color profile and a method for fabricating the same.

2. Description of the Related Art

Figure 1:
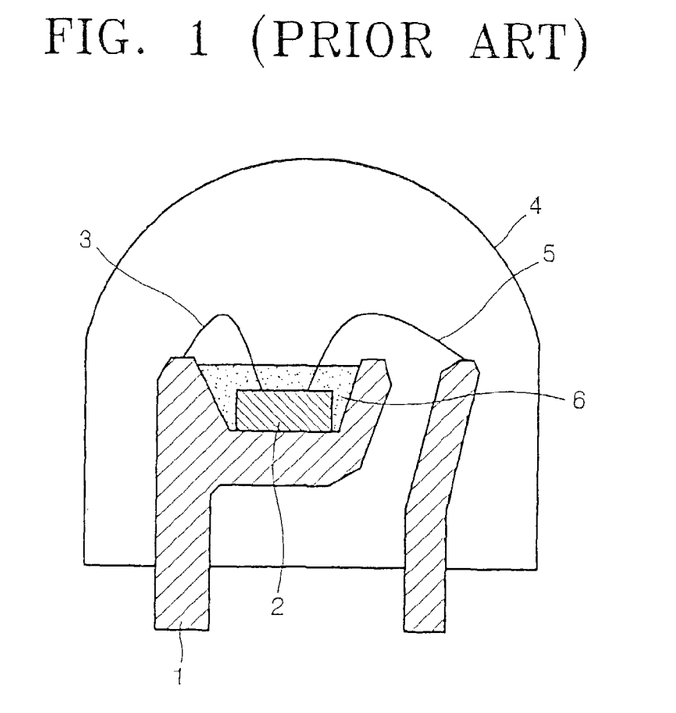
FIG. 1 is a sectional view of a conventional white-light emitting diode.

FIG. 1 is a sectional view of a conventional light emitting diode emitting white light. Referring to FIG. 1, a blue-light emitting diode 2 is located inside a lead frame 1, with wires 3 connected to the top surface thereof via ohmic contact and to the lead frame 1 to supply electricity. The inner space of the lead frame 1 is filled with a phosphor 6 so that blue light emitted from the blue-light emitting diode 2 is converted to red or green light or and then to white light by being mixed up with the red or green light.

However, such a conventional blue-light emitting diode 2 cannot emit homogeneous white light profile and tends to emit light of wavelengths different from the wavelength of white light or conical light with a yellow or blue light ring.

Figure 2:
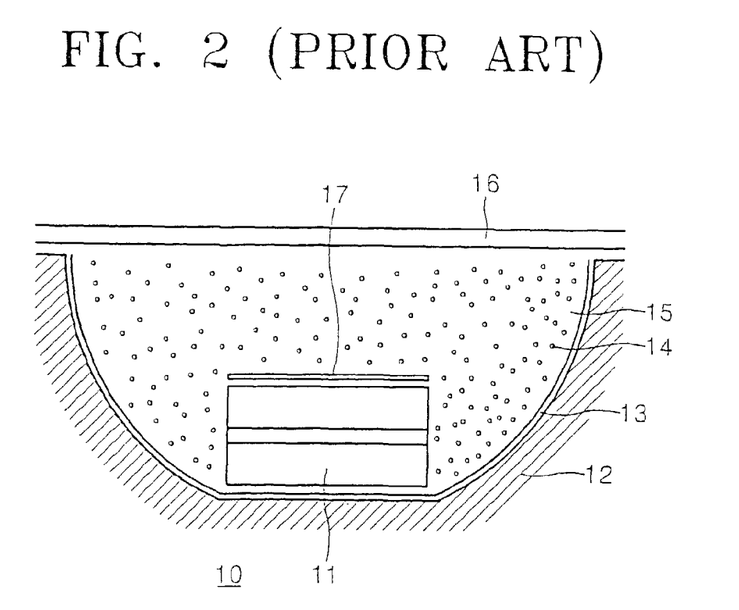
FIG. 2 is a sectional view of a light emitting diode disclosed in U.S. Pat. No. 5,813,753.

Various solutions to this problem have been suggested. For example, according to a light emitting diode disposed in U.S. Pat. No. 5,813,753, as shown in FIG. 2, a light emitting diode 11 is provided in a cup-shaped header 12. A mirror 13 is formed on the inner wall of the header 12 to reflect light emitted from the light emitting diode 11. The inner space of the header 12 is filled with a transparent material 15 containing phosphor grains 14 dispersed around the light emitting diode 11. A glass plate 16 is placed on the top of the header 12 to prevent light which is not absorbed by the phosphor grains 14 from being emitted into the air. A low-wave pass (LWP) filter is further placed on the front side of the light emitting diode 11 to pass short-wavelength light more efficiently than long-wavelength light.

However, in manufacturing such conventional light emitting diodes, it is difficult to control the amount of phosphor grains that is necessary to emit light of desired wavelength bands. A transparent material containing phosphor grains should be deposited for individual light emitting diodes. Accordingly, a great chromatic difference between the separate light emitting diodes occurs, and the manufacturing time increases.

EP O 855 751 A2 discloses an organic/inorganic semiconductor light emitting diode emitting red light and blue light that is manufactured by appropriately doping a green phosphor layer. However, it is difficult to uniformly dope the phosphor layer to an appropriate ion concentration to obtain light of a uniform color profile.

SUMMARY OF THE INVENTION

The present invention provides a light emitting diode with a fluorescent layer having controlled varied thicknesses, wherein the thickness of the fluorescent layer can be appropriately adjusted to enable the light emitting diode to emit light of a desired wavelength band, and a simple method for fabricating the same.

According to an aspect of the present invention, there is provided a light emitting diode comprising: a substrate which transmits light; a semiconductor material layer formed on the top surface of a substrate with an active layer generating light; and a fluorescent layer formed on the back surface of the substrate with controlled varied thicknesses. The substrate may have at least one etched hole formed by etching the back surface of the substrate to controlled varied thicknesses. The fluorescent layer may be formed as dual layers with controlled varied thicknesses. It is preferable that the substrate is a sapphire substrate.

In an embodiment of the light emitting diode according to the present invention, the semiconductor material layer may comprise: a first compound semiconductor layer deposited on the top surface of the substrate; the active layer deposited on the top surface of the first compound semiconductor layer; and a second compound semiconductor layer deposited on the top surface of the active layer. In this case, the first compound semiconductor layer may be an n-type doped or undoped GaN-based III-V nitride compound semiconductor layer. The second compound semiconductor layer may be a p-type doped GaN-based III-V nitride compound semiconductor layer. The active layer may be an n-type doped or undoped $In_xAl_yGa_{1-x-y}N$ compound semiconductor layer where $0 \leq x \leq 1$, $0 \leq y \leq 1$, and $x+y \leq 1$.

In a light emitting diode according to the present invention, the active layer generates blue light, and the fluorescent layer converts a portion of the blue light to yellow light to emit white light from the light emitting diode. In this case, the fluorescent layer may be formed of a fluorescent material including a garnet fluorescent material activated with cerium containing at least one element selected from the group consisting of yttrium, lutetium, scandium, lanthanum, gadolinium, and samarium, and at least one element selected from the group consisting of aluminum, gallium, and indium.

Alternatively, the active layer may generate UV light, and the fluorescent layer may convert the UV light to red, green, and blue light by absorbing the UV light, to emit white light from the light emitting diode. In this case, the fluorescent layer may be formed of a fluorescent material containing a red phosphor selected from the group consisting of $Y_2O_3Eu^{3+}$ $Bi^{3+}$ and $Y_2O_2S$, a green phosphor selected from the group consisting of $(Ba_{1-x-y}Ca_xSr_yEu_z)(Mg_{1-w}Zn_w)Si_2O_7$ and ZnS:Cu, and a blue phosphor selected from the group consisting of $(Sr, Ba, Ca)_5(PO_4)_3Cl:Eu^{2+}$ (SECA), $BaMg_2Al_{16}O_{27}:Eu^{2+}$ (BAM), and $BaMgAl_{10}O_{17}:Eu$.

The present invention provides a light emitting diode with a fluorescent layer having controlled varied thicknesses that can be implemented by etching the back surface of a substrate or by depositing a fluorescent material on the back surface to controlled varied thicknesses. According to the present invention, the emission ratio of original blue light generated in an active layer and light absorbed by the fluorescent layer and converted to yellow light from the blue light can be controlled by appropriately adjusting the thickness of the fluorescent layer, to emit homogeneous white light from the light emitting diode. When the active layer generates UV light, the emission ratio of the original UV light and light absorbed by the fluorescent layer and converted to red, green, and blue light from the UV light can be controlled to emit homogeneous white light from the light emitting diode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments of a light emitting diode and a method for fabricating the same will be described in detail.

Figure 3:
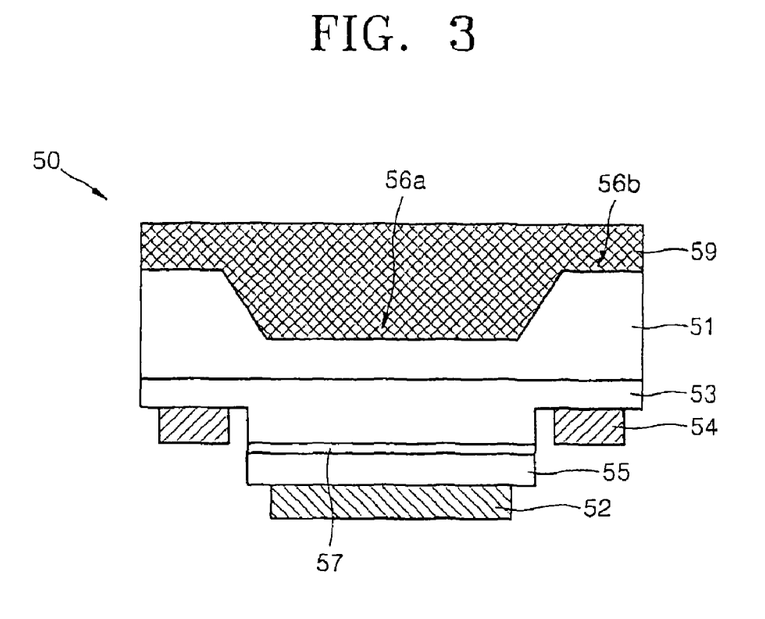
FIG. 3 is a sectional view of a light emitting diode according to a first embodiment of the present invention.

Referring to FIG. 3, which is a sectional view showing the structure of a light emitting diode according to an embodiment of the present invention, a light emitting diode 50 includes a substrate 51, and a first compound semiconductor layer 53, an active layer 57, and a second compound semiconductor layer 55, which are sequentially deposited on the top surface of the substrate 51. An n-type electrode 54 is placed in a stepped region of the first compound semiconductor layer 53, and a p-type electrode 52 is placed on the top surface of the second compound semiconductor layer 55, to supply electrons and holes into the active layer 57.

The substrate 51 is made of a durable substance, mostly such as sapphire. The back surface of the substrate 51 is etched to reduce the thickness of the substrate 51 in certain areas. Here, it is preferable to form an etched hole 56a in the back surface of the substrate 51 by etching. In this case, the thickness of the substrate 51 is larger at a peripheral region 56b than at the etched hole 56a. The different thicknesses of the substrate 51 enable a fluorescent layer 59 to be deposited to controlled varied thicknesses onto the back surface of the substrate 51 by spin coating.

The first compound semiconductor layer 53 is a GaN-based III-V nitride semiconductor layer, and preferably, is a direct transition type. In the case of doping the first compound semiconductor with conductive impurities, a GaN layer is preferable for the first compound semiconductor layer 53. In either case, it is preferable that the first compound semiconductor layer 53 is formed of the same maternal as the second compound semiconductor layer 55. A first cladding layer (not shown) may be further formed on the top surface of the first compound semiconductor layer 53. Preferably, the first cladding layer may be formed of an n-AlGaN/GaN layer having a predetermined refractive index. However, the first cladding layer may be formed of a compound semiconductor layer different from the n-AlGaN/GaN layer.

The second compound semiconductor layer 55 is a GaN-based III-V nitride semiconductor layer, and preferably, is a direct transition type doped with p-type conductive impurities, and most preferably, is a p-GaN layer. In the case of undoping the second compound semiconductor layer 55, a GaN layer or a AlGaN layer or InGaN layer containing Al or In, respectively, in a predetermined ratio may be used for the second compound semiconductor layer 55.

The active layer 57 is formed on the top surface of the first compound semiconductor layer 53. The active layer 57 is a material layer where light is generated by the recombination of electrons and carrier holes. Preferably, the active layer 57 is a GaN-based III-V nitride semiconductor layer with a multiple quantum-well (MQW) structure. More preferably, the active layer 57 is formed of a $In_xAl_yGa_{1-x-y}N$, where $0 \leq x \leq 1$, $0 \leq y \leq 1$, and $x+y \leq 1$, with a MQW structure.

First and second waveguide layers (not shown) may be further formed on and underneath the active layer 57, respectively, to amplify light emitted from the active layer 57 and emit light from the LED with enhanced intensity. The first and second waveguide layers are formed of a smaller refractive index material than the active layer 57, and preferably, for example, a GaN-based III-V compound semiconductor layer. The first waveguide layer may be formed of a n-GaN layer, and the second waveguide layer may be formed of a p-GaN layer. The active layer 57-may be formed of any material having a small threshold current value and stable transverse mode properties. Preferably, the active layer 57 is formed of an AlGaN layer containing Al in a predetermined ratio.

The second compound semiconductor layer 55 is formed on the top surface of the active layer 57. A second cladding layer (not shown) having a smaller refractive index than the second waveguide layer may be additionally formed between the second compound semiconductor layer 55 and the active layer 57. This second cladding layer is formed of a p-type compound semiconductor layer when the first cladding layer is formed of a n-type compound semiconductor layer, and is formed of a p-type compound semiconductor layer when the first cladding layer is formed of a p-type compound semiconductor layer. For example, when the first cladding layer is formed of a n-AlGaN/GaN layer, the second cladding layer is formed of a p-AlGaN/GaN layer.

A pair of n-type electrodes 54 are laid on the two stepped regions of the first compound semiconductor layer 53, and the p-type electrode 52 is laid on the top surface of the second compound semiconductor layer 55, via which electrons and holes are injected into the first compound semiconductor layer 53 and the second compound semiconductor layer 55, respectively. The injected electrons and holes combine together and disappear in the active layer 57 to oscillate light of a short-wavelength band. The color of emitted light varies depending on the wavelength band. The wavelength band of light is determined by the energy width between the conduction band and valence band of the material used to form the light emitting diode 50.

III-V nitrides are commonly used to form semiconductor material layers emitting blue, green, and UV light. In the present invention, specifically, GaN-based semiconductor materials among III-V nitrides are used to enable the active layer 57 to generate blue light of a wavelength of 420-470 nm or UV light and the generated blue light to be transmitted through a fluorescent layer 59 deposited on the back surface of the substrate 51. A portion of the generated blue light is absorbed in the fluorescent layer 59 and emitted as light of a different wavelength band from the original blue light, for example, yellow light, and the non-absorbed blue light is emitted as blue light having the original wavelength.

Various kinds of fluorescent materials may be selectively used depending on the wavelength band of desired light to emit. When a light emitting diode is formed of a nitride semiconductor material emitting blue light, as a fluorescent material capable of converting the blue light to yellow light, a garnet fluorescent material activated with cerium (Ce) including at least one element selected from the group consisting of yttrium (Y), lutetium (Lu), scandium (Sc), lanthanum (La), gadolinium (Gd), and samarium (Sm), and at least one element selected from the group consisting of aluminum (Al), gallium (Ga), and indium (In) may be used. To control the wavelength of emitted light, in a mixture of Y group, Al group, and garnet fluorescent materials, two kinds of fluorescent materials selected from the Y group may be used together in non-equal amounts. For example, a portion of Y may be substituted by Gd.

In a light emitting diode with an active layer emitting blue light of a wavelength of 420-470 nm, suitable fluorescent materials capable of converting the blue light to red light of a wavelength of 610-625 nm include $Y_2O_2S:Eu^{3+},Bi^+$; $YVO_4$: $Eu^{3+},Bi^{3+}$; $SrS:Eu^{2+}$; $SrY_2S_4:Eu^{2+}$; $CaLa_2S_4:Ce^{3+}$; $(Ca, Sr)S:Eu^{2+}$ and the like. Suitable fluorescent materials capable of converting the blue light to green light of a wavelength of 530-555 nm include $YBO_3:Ce^{3+}$, $Tb^{3+}$; $BaMgAl_{10}O_{17}:Eu^{2+}$, $Mn^{2+}$; $(Sr,Ca,Ba)(Al,Ga)_2S_4:Eu^{2+}$ and the like. Any fluorescent material emitting red light or green light may be used.

When a light emitting diode is formed of a nitride semiconductor material emitting UV light, a fluorescent material containing a red phosphor, such as $Y_2O_3Eu^{3+}Bi^{3+}$ and $Y_2O_2S$, a green phosphor, such as $(Ba_{1-x-y-z}Ca_xSr_yEu_z)(Mg_{1-w}Zn_w)Si_2O_7$ and $ZnS:Cu$, and a blue phosphor, such as $(Sr, Ba,Ca)_5(PO_4)_3Cl:Eu^{2+})$ (SECA), $BaMg_2Al_{16}O_{27}:Eu^{2+}$ (BAM), and $BaMgAl_{10}O_{17}:Eu$, is used for the fluorescent layer 59 formed on the etched back surface of the substrate having controlled varied thicknesses. In this case, UV light generated in the active layer 57 is converted to red, green, and blue light while propagating through the fluorescent layer 59 and finally emitted from the light emitting diode as white light.

In the present invention, as shown in FIG. 3, since the back surface of the substrate 51 has the etched hole 56a, which is filled with the fluorescent layer 56, the thickness of the fluorescent layer 59 is larger at the etched hole 56a than at the peripheral region 56b. As a result, light generated in the active layer 57 is absorbed more by the fluorescent material while propagating through the thicker region of the fluorescent layer 59a than through the thinner region corresponding to the peripheral region 56b so that a larger amount of light whose wavelength band is shifted compared to the original light is emitted.

While the wavelength of emitted light is controlled using fluorescent materials in conventional light emitting diodes, the thickness of the fluorescent layer 59 is appropriately varied in the present invention in order to emit light of a desired wavelength band. Alternatively, luminescence can be enhanced by changing the shape of the etched hole 56a of the substrate 51. For example, the sloping angle and the bottom curvature of the etched hole 56a may be varied in order to control the amount of light incident on the fluorescent layer 59 through the substrate.

Figure 4:
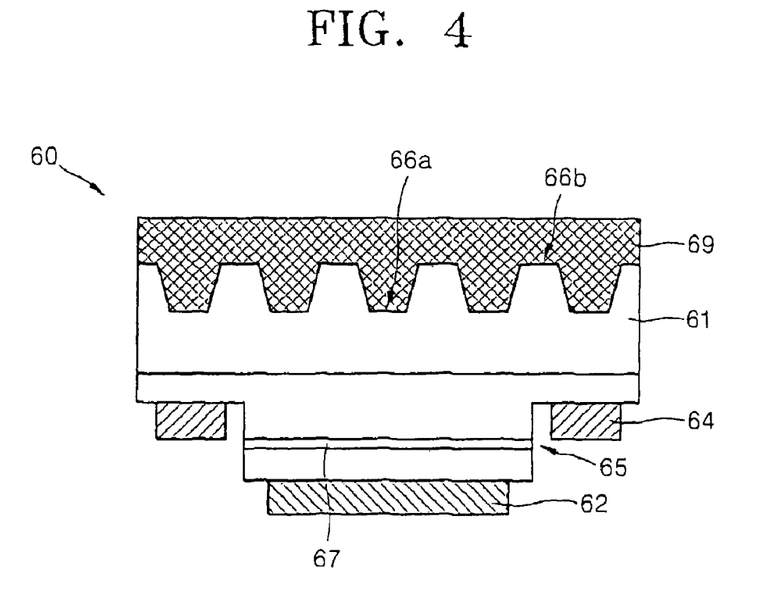
FIG. 4 is a sectional view of a light emitting diode according to a second embodiment of the present invention.

FIG. 4 is a sectional view of a light emitting diode according to a second embodiment of the present invention with a plurality of etched holes.

Referring to FIG. 4, the back surface of the substrate 61 is etched to form a plurality of etched holes 66a, and a fluorescent layer 69 is formed to fill over the etched holes 66a in the substrate 61, so that the structure of a light emitting diode as shown in FIG. 4 is obtained.

Blue light or UV light generated in an active layer 67 of a semiconductor material layer 65 is transmitted through the substrate 62 and enters the fluorescent layer 69. Since the fluorescent layer 69 has a larger thickness at the etched holes 66a than at peripheral regions 66b, light incident on the etched holes 66a and propagating through the thicker region of the fluorescent layer 69 is likely to excite and absorb more fluorescent grains present in the fluorescent layer 69, compared with light propagating through the peripheral regions 66b. In other words, the blue light or UV light generated in the active layer 67 is highly likely to be converted to yellow light, or red, green and blue light having a different wavelength from the original blue or UV light while propagating through the thicker region of the fluorescent layer 69, where the etched holes 66a are formed. Also, light propagating through the thinner region of the fluorescent layer 69, where the peripheral regions 66b are formed, is highly likely to be emitted as the original blue or UV light, without shifting in wavelength band.

The thickness of the fluorescent layer 69 can be adjusted to different levels by appropriately varying the number and the depth of etched holes 66a. As a result, light generated in the active region 67 of the semiconductor material layer 65 is converted to light of wavelength bands different from the original light while propagating through the fluorescent layer 69, so that homogeneous white light can be emitted from the light emitting diode.

In FIG. 4, reference numeral 62 denotes a p-type electrode, and reference numeral 64 denotes an n-type electrode. The material, properties, and function of the compound semiconductor layers constituting the light emitting diode of FIG. 4 are the same as those of the light emitting diode according to the first embodiment described above.

Figure 5:
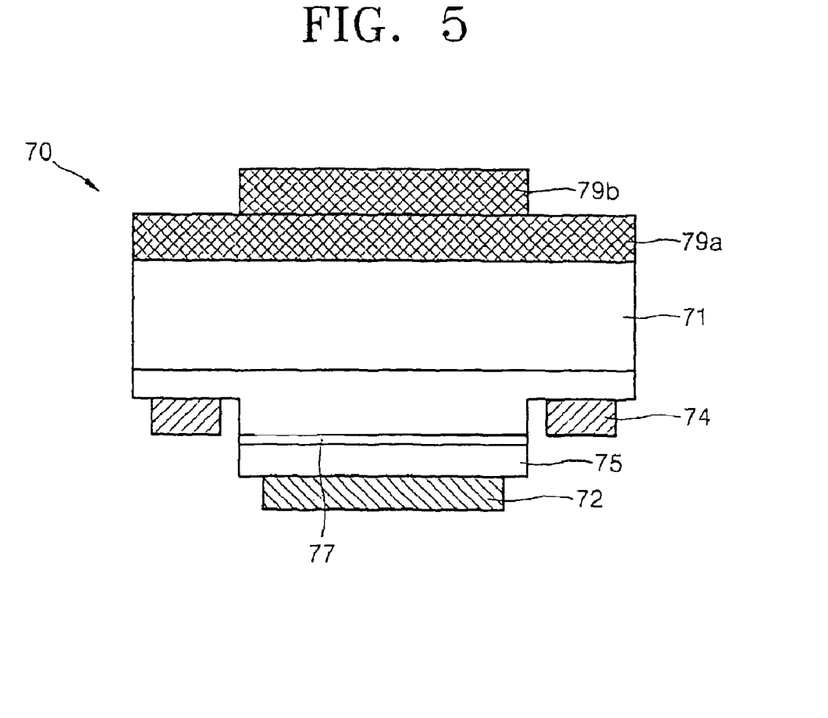
FIG. 5 is a sectional view of a light emitting diode according to a third embodiment of the present invention.

FIG. 5 is a sectional view showing the structure of a light emitting diode according to a third embodiment of the present invention. Referring to FIG. 5, a substrate 71 has a uniform thickness. A first fluorescent layer 79a is deposited on the back surface of the substrate 71, and a second fluorescent layer 79b is formed on a region of the first fluorescent layer 79a. Accordingly, the entire fluorescent layer, including the first and second fluorescent layers 79a and 79b, has controlled varied thicknesses. Reference numeral 72 denotes a p-type electrode, reference numeral 74 denotes an n-type electrode, and reference numeral 75 denotes a semiconductor material layer.

Figure 6:
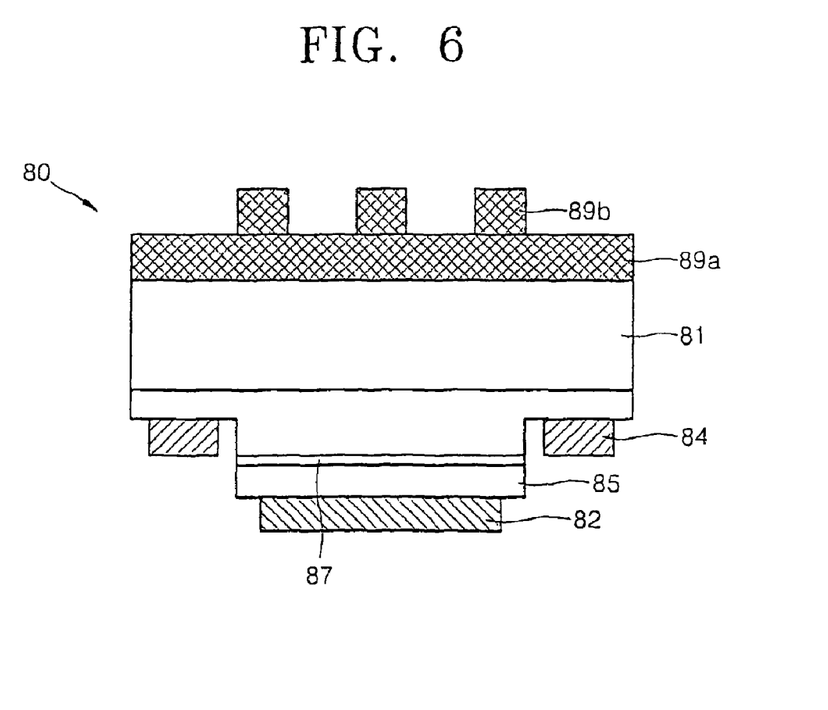
FIG. 6 is a sectional view of a light emitting diode according to a fourth embodiment of the present invention.

FIG. 6 is a sectional view showing the structure of a light emitting diode according to a fourth embodiment of the present invention. Referring to FIG. 6, a substrate 81 has a uniform thickness. A first fluorescent layer 89a is deposited on the back surface of the substrate 81, and a plurality of second fluorescent layers 89b are formed on the first fluorescent layer 89a as stripes. Accordingly, the entire fluorescent layer, including the first and second fluorescent layers 89a and 89b, has controlled varied thicknesses. Reference numeral 72 denotes a p-type electrode, reference numeral 74 denotes an n-type electrode, and reference numeral 75 denotes a semiconductor material layer. Alternatively, a plurality of second fluorescent layers 89a may be formed as dots.

In the above-described third and fourth embodiments, the material, properties, and function of the compound semiconductor layer constituting each of the light emitting diodes are the same as those of the light emitting diode according to the first embodiment of the present invention. The principles of emitting white light using the fluorescent layers 79a (89a) and 79b (89b) having controlled varied thicknesses are similar to those as in the first embodiment. Although the fluorescent layer having controlled varied thicknesses is implemented by etching the substrate in the light emitting diodes according to the first and second embodiments of the present invention, in the light emitting diodes according to the third and fourth embodiments of the present invention, the fluorescent layer having controlled varied thicknesses is implemented using two separate fluorescent layers 79a (89a) and 79b (89b).

In the light emitting diodes according to the third and fourth embodiments of the present invention, when blue or UV light generated in the active layer 77 (87) of the semiconductor material layer 75 (85) propagates through both of the first and second fluorescent layers 79a (89a) and 79b (89b), the blue or UV light is highly likely to be shifted in wavelength band and emitted as yellow light or red, green, and blue light, compared with blue or UV light propagating only through the first fluorescent layer 79a (89a). In other words, it is possible to generate homogeneous white light by appropriately varying the thickness and the number of patterns constituting the second fluorescent layer 79b (89b).

The light emitting diodes according to the first through fourth embodiments of the present invention described above are for illustrative purposes and, therefore, the shape and number of etched holes and the thickness and the shape of the fluorescent layer may be variously changed.

Figure 7A:
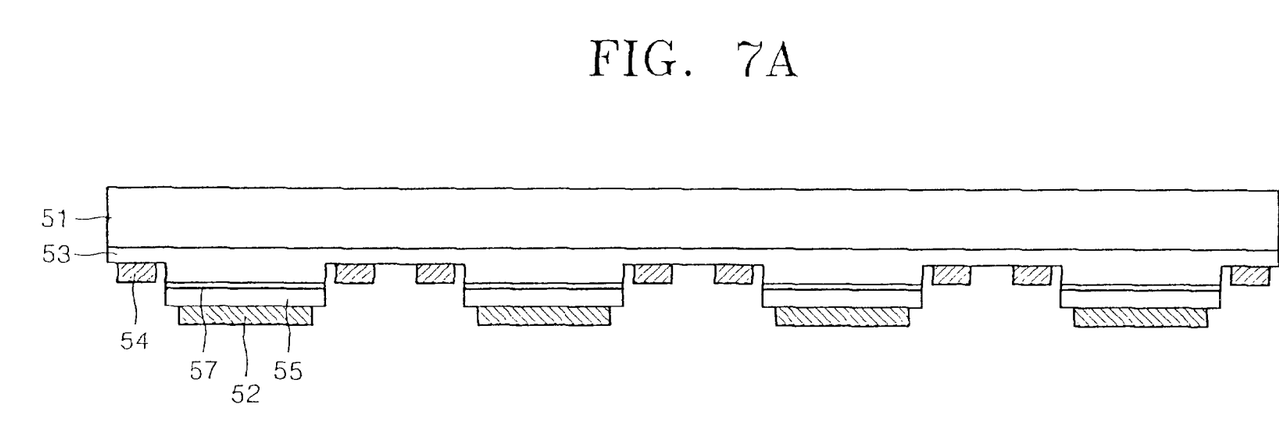
FIGS. 7A through 7D are sectional views illustrating a first embodiment of a method for manufacturing light emitting diodes according to the present invention.

FIGS. 7A through 7D are sectional views illustrating a first embodiment of a method for fabricating light emitting diodes according to the present invention. Referring to FIG. 7A, a first compound semiconductor layer 53, an active layer 57, and a second compound semiconductor layer 55 are deposited in sequence on the top surface of a substrate 51, and the first compound semiconductor layer 53 is patterned by photolithography to form a step in the first compound semiconductor layer 53. N-type electrodes 54 are laid on the patterned surface of the first compound semiconductor layer 53 as stripes, and p-type electrodes 52 are laid on the top surface of the second compound semiconductor layer 55.

Figure 7B:
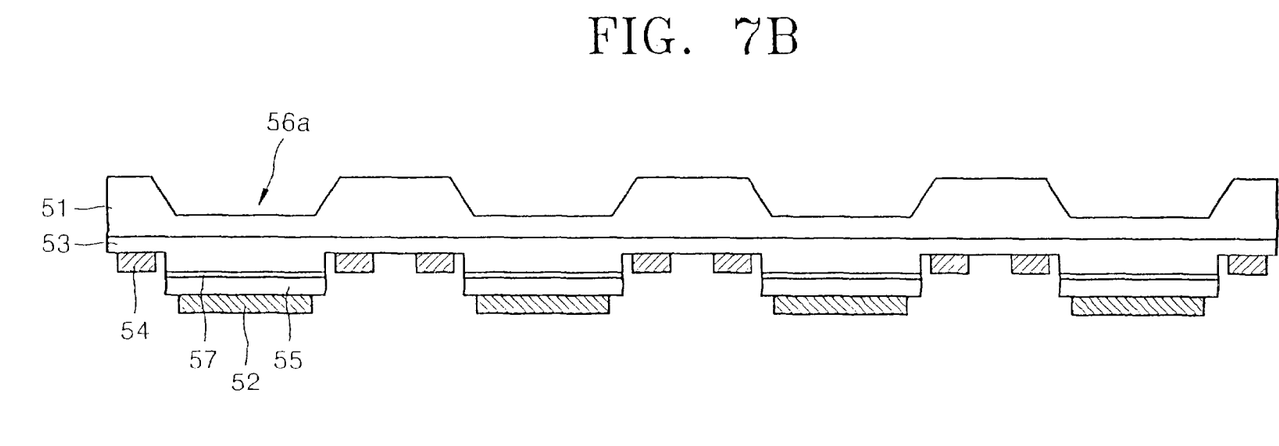

Referring to FIG. 7B, etched holes 56b, which are filled with a fluorescent layer 57 later, are formed in the back surface of the substrate 51 by dry etching. Prior to etching the substrate 51, the back surface of the substrate 51 is processed by grinding, lapping, or polishing. A mask layer (not shown) is formed on the back surface of the substrate 51 and patterned into a mask pattern corresponding to the etched holes 56a. The back surface of the substrate 51 is etched using at least one gas selected from the group consisting of $Cl_2$, $BCl_3$, Ar, $O_2$, and HBr, with the mask pattern serving as an etch mask, so that the etched holes 56 are formed as shown in FIG. 7B.

Figure 9A:
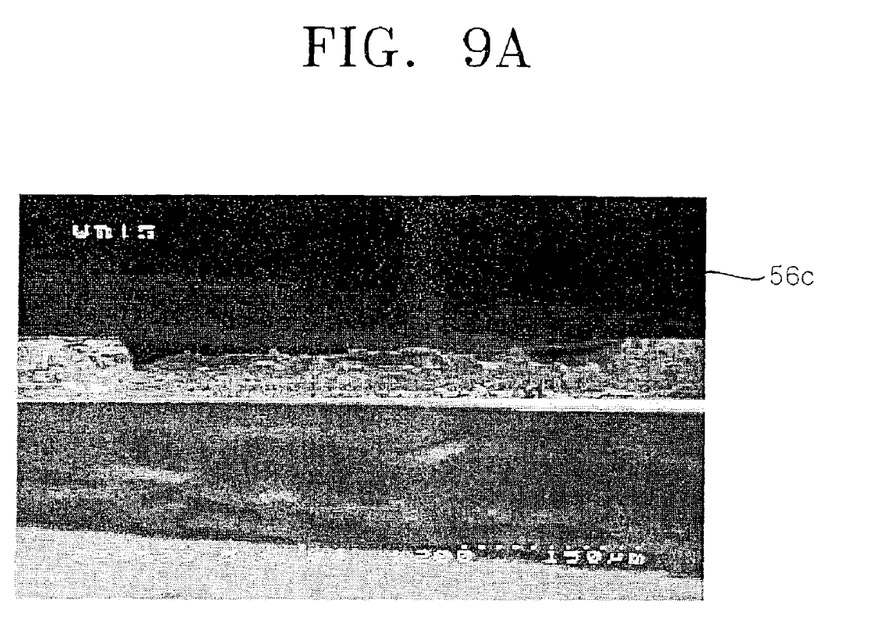
FIGS. 9A and 9B are photographs showing etched substrates of light emitting diodes according to the first embodiment of the present invention.
Figure 9B:
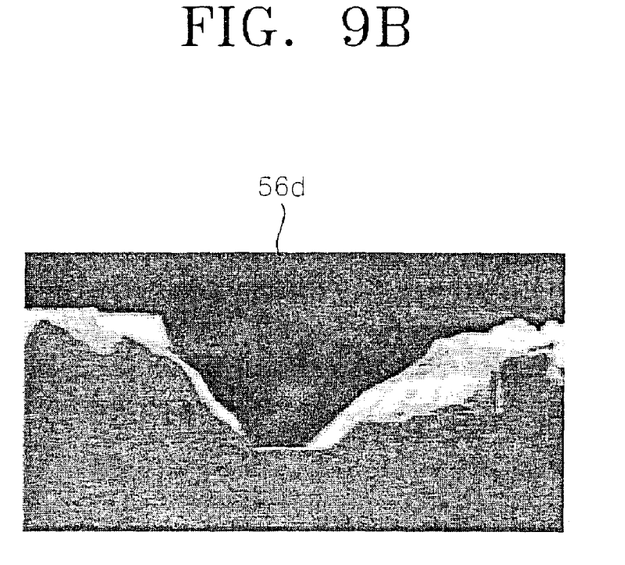

FIGS. 9A and 9B show etched holes formed in sapphire substrates by etching. Etched holes 56c of FIG. 9A are relatively wide and shallow, and etched holes 56d of FIG. 9B are relatively narrow and deep. The depth and width of the etched holes 56c (56d) are determined in consideration of the thickness of the fluorescent layer deposited therein. For example, the back surface of a sapphire substrate is etched such that the resulting etched holes 56c (56d) have a depth of about 50 μm and a width of 250-500 μm.

Figure 7C:
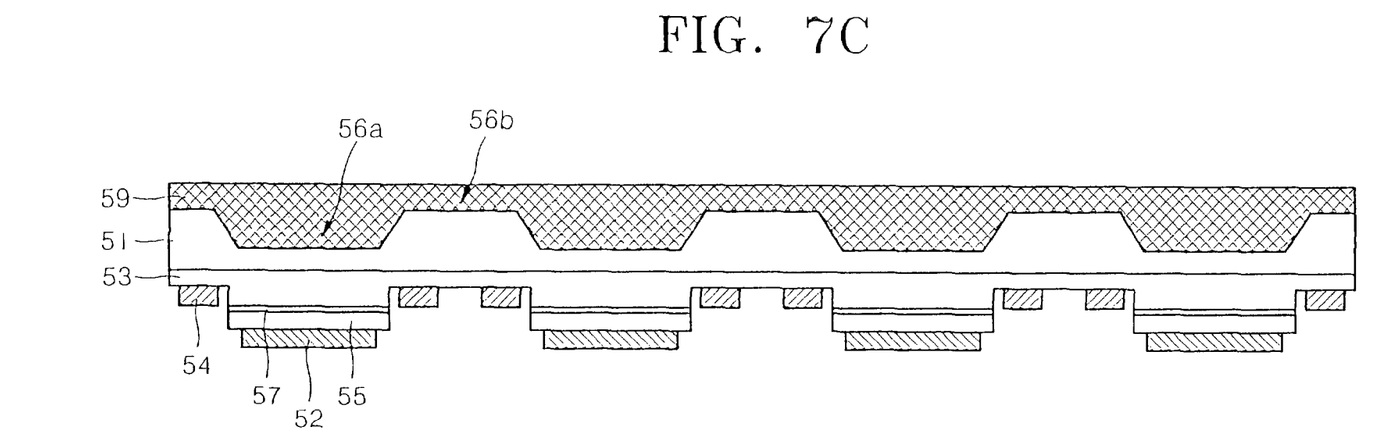

Referring to FIG. 7C, after the etched holes 56a have been formed, a fluorescent material is applied to the etched holes 56a and the peripheral regions 56b by disposing or spin coating to form the fluorescent layer 59, as shown in FIG. 6C. As a result, a light emitting diode structure 58 is formed. According to the present invention, the fluorescent layer 59 can be uniformly deposited over the entire substrate 51 through a single process. Therefore, the overall process for fabricating light emitting layer diodes is simple.

Figure 10A:
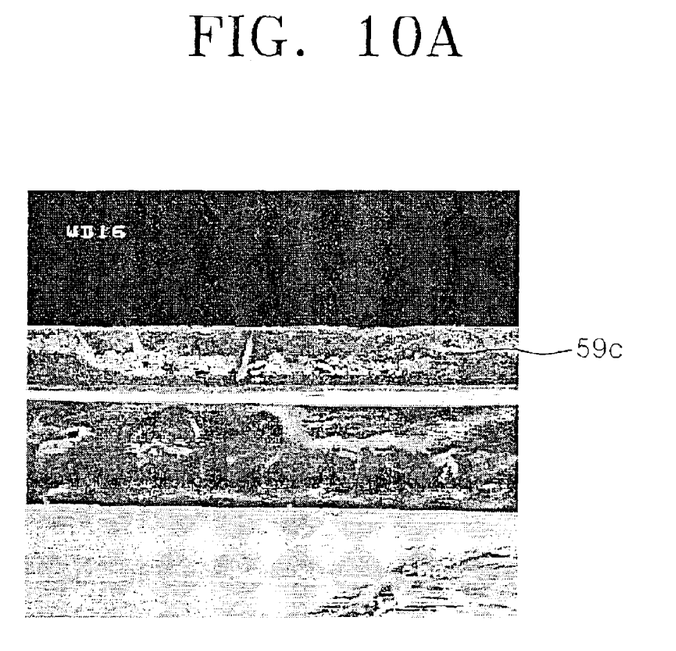
FIGS. 10A and 10B are photographs showing the back surface of the substrates of FIGS. 9A and 9B, respectively, with fluorescent layers.
Figure 10B:
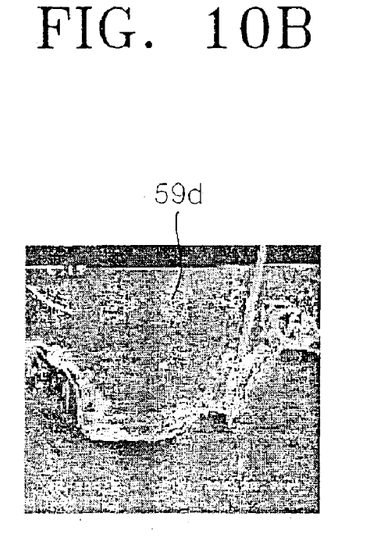

FIGS. 10A and 10B are photographs of light emitting diodes with yttrium-aluminum-garnet (YAG) fluorescent layers 59c and 59d formed by applying a fluorescent material to fill the etched holes 56c and 56d in the back surface of the substrates of FIGS. 9A and 9B, respectively. In FIGS. 10A and 10B, the YAG fluorescent layers 59c and 59d in the etched holes appear white.

Figure 7D:
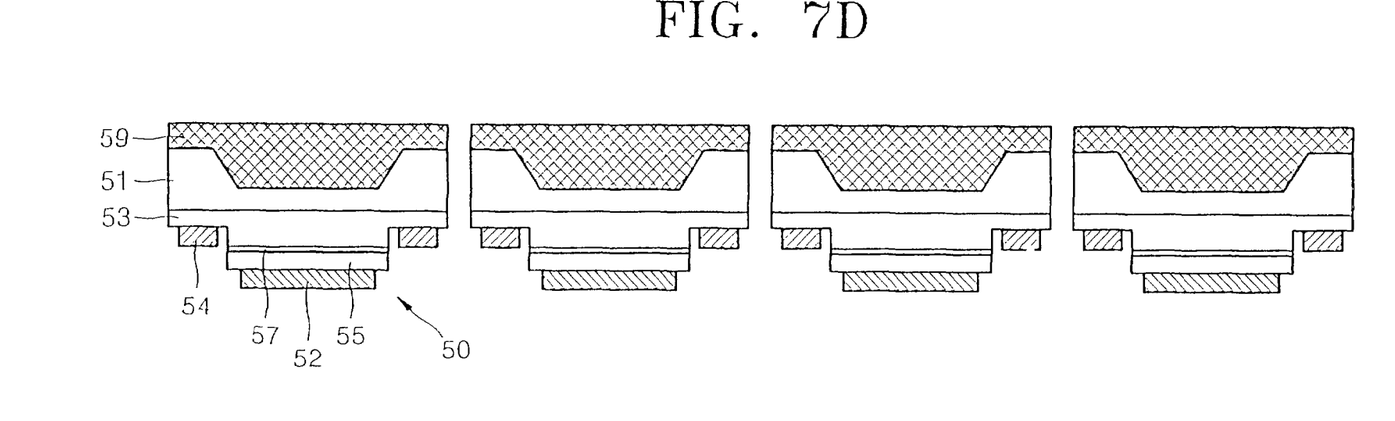

Finally, as shown in FIG. 7D, the light emitting diode structure 58 is cut, at connection regions with two adjacent n-type electrodes 54, into a plurality of light emitting diodes 50.

Figure 8A:
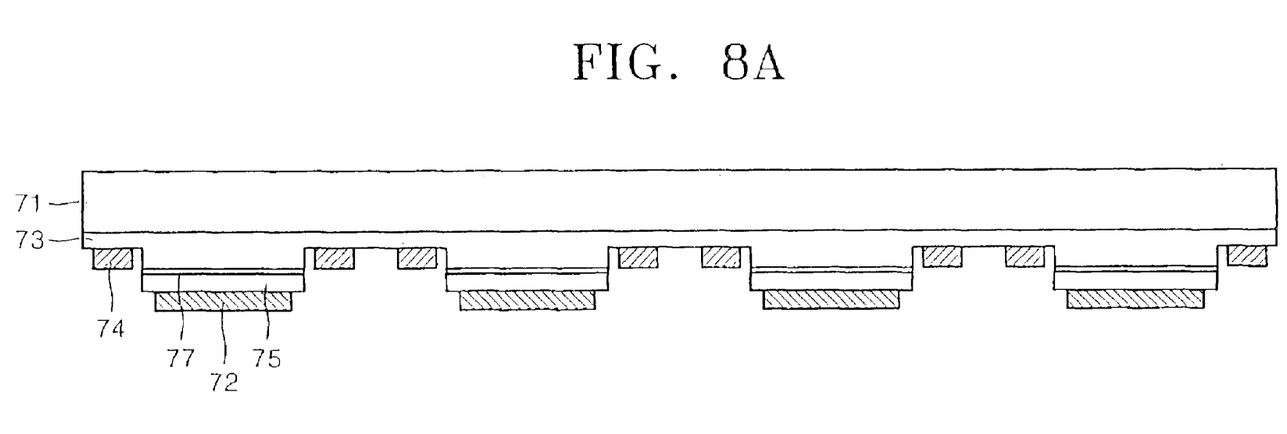
FIGS. 8A through 8E are sectional views illustrating a second embodiment of the method for manufacturing light emitting diodes according to the present invention.

FIGS. 8A through 8E are sectional views illustrating a second embodiment of the method for fabricating light emitting diodes according to an embodiment of the present invention. Referring to FIG. 8A, a first compound semiconductor layer 73, an active layer 77, and a second compound semiconductor layer 75 are deposited in sequence on the top surface of a substrate 71, and the first compound semiconductor layer 73 is patterned by photolithography to form a step in the first compound semiconductor layer 73. N-type electrodes 74 are laid on the patterned surface of the first compound semiconductor layer 73 as stripes, and p-type electrodes 72 are laid on the top surface of the second compound semiconductor layer 75.

Figure 8B:
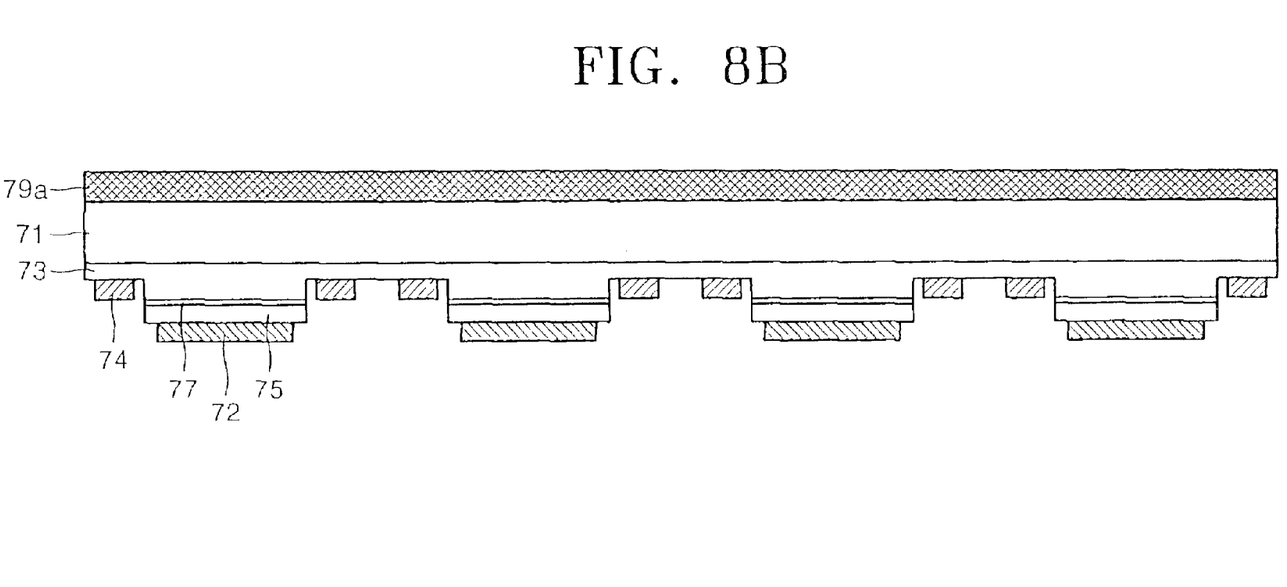
Figure 8C:
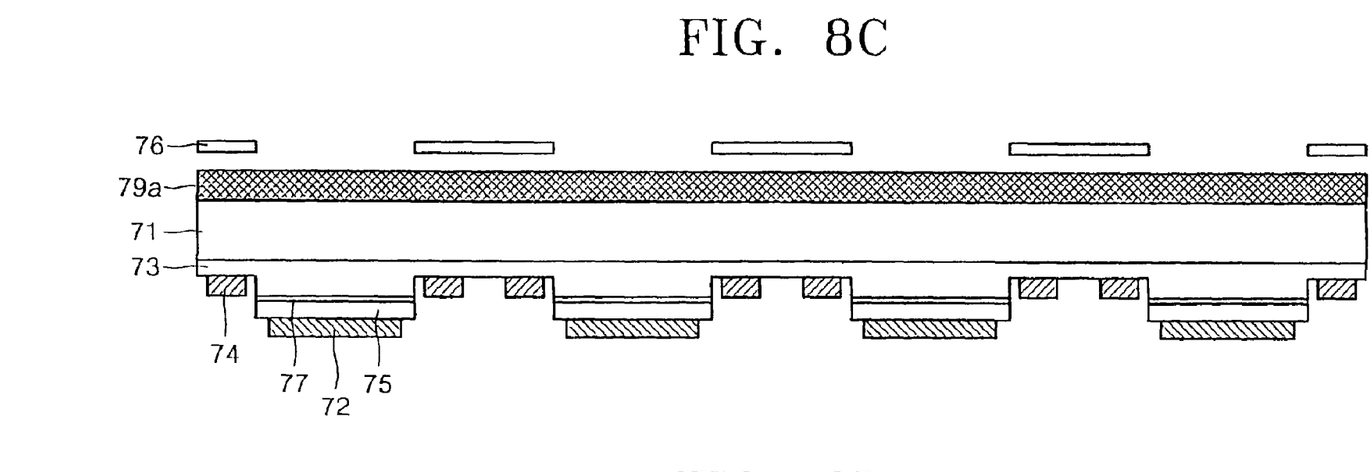
Figure 8D:
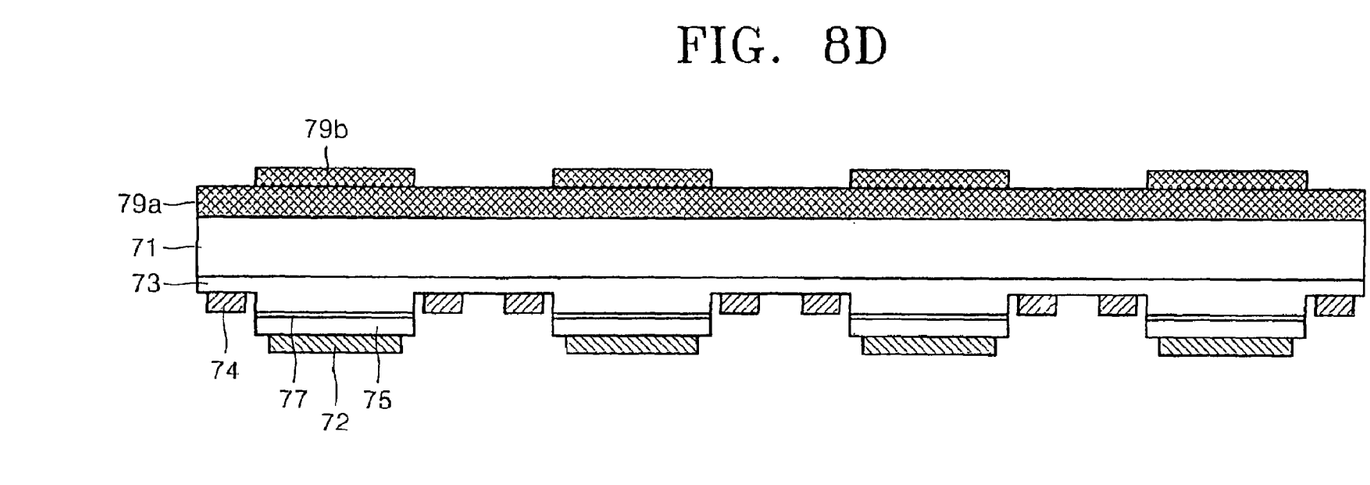
Figure 8E:
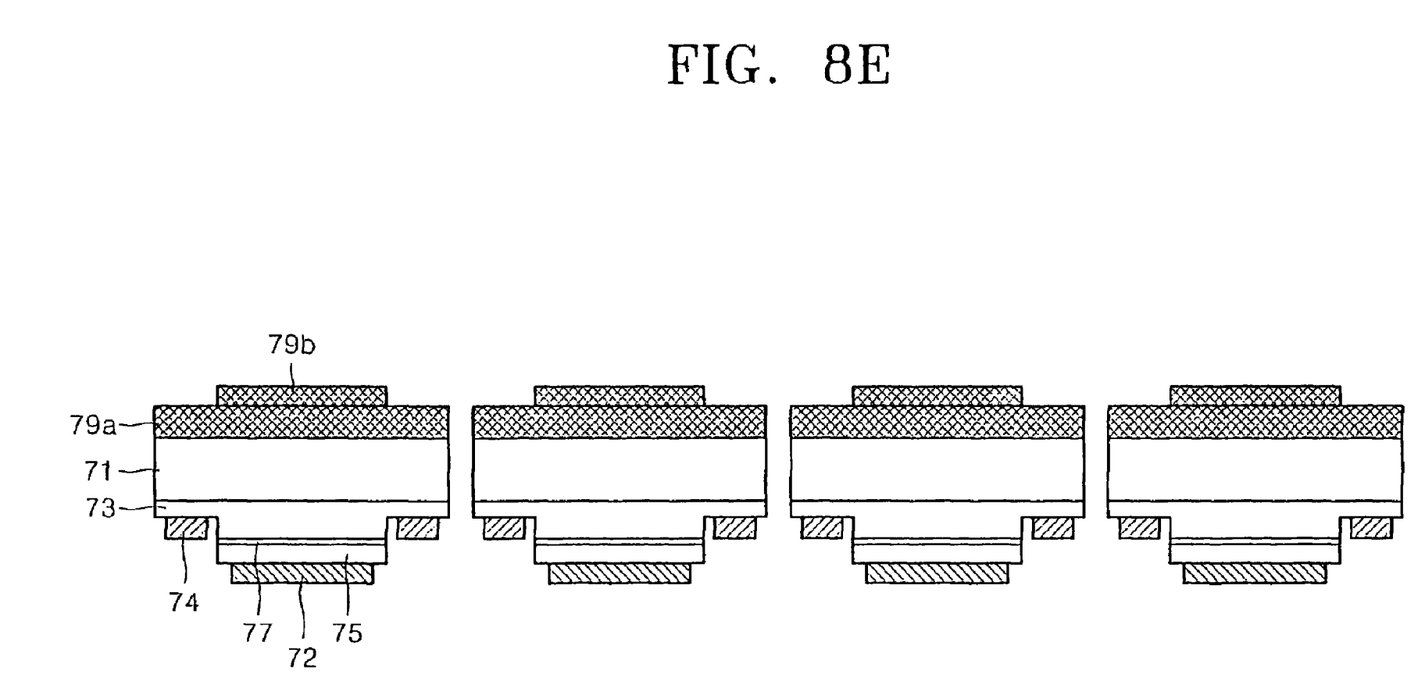

Referring to FIG. 8B, a fluorescent material is applied to the back surface of the substrate 71 by disposing or spin coating to form a first fluorescent layer 79a. Next, as shown in FIG. 8C, a mask 76 having a predetermined pattern is placed on the first fluorescent layer 79a, and the fluorescent material is applied to form a a second fluorescent layer 79b on the first fluorescent layer 79a. As a result, a light emitting diode structure 78 with a fluorescent layer, including the first and second fluorescent layers 79a and 79b, having controlled varied thicknesses is formed, as shown in FIG. 8D. Finally, as shown in FIG. 8E, the light emitting diode structure 78 is cut into a plurality of light emitting diodes 50, thereby completing the fabrication of desired light emitting diodes 50.

A light emitting diode according to the present invention is fabricated with a fluorescent layer having controlled varied thicknesses, wherein the fluorescent layer having controlled varied thicknesses may be formed by etching a substrate to controlled varied thicknesses and applying a fluorescent material to the etched surface of the substrate. Alternatively, the fluorescent layer having controlled varied thicknesses may be formed by depositing a fluorescent material to controlled varied thicknesses on a substrate having a uniform thickness. In the light emitting diode according to the present invention, light generated in an active layer is shifted in wavelength while passing through the fluorescent layer having controlled varied thicknesses. The ratio of light whose wavelength band is shifted while propagating through the fluorescent layer and the original light generated in the active layer can be controlled by varying the thickness of the fluorescent layer so that desired homogeneous white light can be emitted from the light emitting diode according to the present invention. A method for fabricating light emitting diodes according to the present invention, which involves simple processes, for example, etching the back surface of a substrate or applying a fluorescent material over the substrate by disposing or spin coating, is suitable for mass production.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A light emitting diode comprising:
a substrate which transmits light, the substrate having a top surface and a back surface opposite the top surface;

a first semiconductor layer, an active layer generating a first light, and a second semiconductor layer disposed, in that order, on the top surface of the substrate, a fluorescent layer formed on the back surface of the substrate, and converting a portion of the first light to second light having a different wavelength from the first light; and wherein the substrate has at least one etched hole defined in a portion of the back surface of the substrate, and portions of the back surface of the substrate surrounding the at least one etched hole are planar, and the fluorescent layer fills all the inside of the at least one etched hole, wherein the fluorescent layer includes at least one relatively thick area and at least one relatively thin area such that the first light is converted into the second light with higher efficiency in the at least one thick area than in the at least one thin area wherein the at least one relatively thick area of the fluorescent layer is formed in the at least one etched hole and the at least one relatively thin area of the fluorescent layer is formed on the portions of the back surface of the substrate surrounding the at least one etched hole.

2. The light emitting diode of claim 1, wherein the fluorescent layer is formed as dual layers with different patterns.

3. The light emitting diode of claim 1, wherein the substrate is a sapphire substrate.

4. The light emitting diode of claim 1, wherein the semiconductor material layer comprises:

a first compound semiconductor layer deposited on the top surface of the substrate;

the active layer deposited on the top surface of the first compound semiconductor layer; and a second compound semiconductor layer deposited on the top surface of the active layer.

5. The light emitting diode of claim 4, wherein the first compound semiconductor layer is an n-type doped or undoped GaN-based III-V nitride compound semiconductor layer.

6. The light emitting diode of claim 4, wherein the second compound semiconductor layer is a p-type doped GaN-based III-V nitride compound semiconductor layer.

7. The light emitting diode of claim 4, wherein the active layer is an n-type doped or undoped InAlGaN compound semiconductor layer where $0 \leq x \leq 1$, $0 \leq y \leq 1$, and $x+y \leq 1$.

8. The light emitting diode of claim 1, wherein the second light is yellow light.

9. The light emitting diode of claim 8, wherein the fluorescent layer is formed of a fluorescent material including a garnet fluorescent material activated with cerium containing at least one element selected from the group consisting of yttrium, lutetium, scandium, lanthanum, gadolinium, and samarium, and at least one element selected from the group consisting of aluminum, gallium, and indium.

10. The light emitting diode of claim 1, wherein a difference in thicknesses between the at least one relatively thick area and the at least one thin area is substantially 50 μm.

11. The light emitting diode of claim 1, wherein the width of at least one relatively thick area substantially ranges between 250 μm and 500 μm.

12. The light emitting diode of claim 1, wherein the first light is blue light of a wavelength of 420~470 nm, and the second light includes at least one fluorescent material of $Y_2O_2S:Eu^{3+},Bi^{3+}$, $YVO_4:Eu^{3+},Bi^{3+}$, $SrS:Eu^{2+}$, $SrY_2S_4:Eu^{2+}$, $CaLa_2S_4:Ce^{3+}$, $(Ca, Sr)S:Eu^{2+}$ and at least one fluorescent material of $YBO_3:Ce^{3+},Tb^{3+}$, $BaMgAl_{10}O_{17}:Eu^{2+},Mn^{2+}$, $(Sr, Ba, Ca)(Al, Ga)_2S_4:Eu^{2+}$.

13. The light emitting diode of claim 1, wherein the first light is UV light, and the second light includes red, green and blue light.

14. The light emitting diode of claim 1, wherein the first light is blue light of a wavelength of 420~470 nm, and the second light is yellow light.

15. The light emitting diode of claim 1, wherein the first light is blue light of a wavelength of 420~470 nm, and the second light includes red and green.

16. The light emitting diode of claim 1, wherein the first light is blue light of a wavelength of 420~470 nm, and the second light includes red of a wavelength of 610-625 nm and/or green of a wavelength of 530~555 nm.

17. The light emitting diode of claim 1, wherein the at least one hole has a sloped sidewall.

* * * * *